(12) United States Patent
Terada et al.

(10) Patent No.: US 8,146,438 B2
(45) Date of Patent: Apr. 3, 2012

(54) PRESSURE-SENSITIVE ADHESIVE SHEET FOR TESTING

(75) Inventors: Yoshio Terada, Ibaraki (JP); Fumiteru Asai, Ibaraki (JP); Hirokuni Hashimoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/513,230

(22) PCT Filed: Oct. 9, 2008

(86) PCT No.: PCT/JP2008/068338
§ 371 (c)(1),
(2), (4) Date: May 1, 2009

(87) PCT Pub. No.: WO2009/060686
PCT Pub. Date: May 14, 2009

(65) Prior Publication Data
US 2010/0313667 A1    Dec. 16, 2010

(30) Foreign Application Priority Data
Nov. 8, 2007  (JP) .................................. 2007-291252

(51) Int. Cl.
*G01L 9/00*  (2006.01)
(52) U.S. Cl. .......................................................... 73/754
(58) Field of Classification Search .................. None
See application file for complete search history.

(56) References Cited

U.S. PATENT DOCUMENTS 6,313,729 B1 * 11/2001 Winterer et al. ............... 338/36
6,344,155 B1   2/2002 Kitahara et al.
2004/0163475 A1 * 8/2004 Ikezawa et al. ................. 73/753
2006/0070449 A1 * 4/2006 Yokoyama et al. ............. 73/754
2006/0179952 A1 * 8/2006 Tavares et al. .................. 73/754

FOREIGN PATENT DOCUMENTS

| JP | 52-006465   | 1/1977  |
| JP | 60-102750   | 6/1985  |
| JP | 4-070937    | 3/1992  |
| JP | 7-294585    | 11/1995 |
| JP | 11-080682   | 3/1999  |
| JP | 2000-290616 | 10/2000 |
| JP | 2003-020462 | 1/2003  |
| JP | 2005-263876 | 9/2005  |

OTHER PUBLICATIONS

International Search Report issued on the corresponding PCT Application No. PCT/JP2008/068338, dated Jan. 20, 2009.
International Search Report issued on the related PCT Application No. PCT/JP2008/068340, dated Jan. 27, 2009.

* cited by examiner

*Primary Examiner* — Andre Allen
(74) *Attorney, Agent, or Firm* — Knobbe Martens Olson & Bear LLP

(57) ABSTRACT

Disclosed is an adhesive sheet for inspection, which is obtained by arranging an adhesive layer on a base film. The base film and the adhesive layer are electrically conductive, and an electrically conductive path is formed between the base film and the adhesive layer. Consequently, an inspection for electrical conduction of a semiconductor wafer or a semiconductor chip obtained by dicing a semiconductor wafer can be performed while the semiconductor wafer or the semiconductor chip is bonded to the adhesive sheet. In addition, this adhesive sheet for inspection enables to prevent deformation (warping) or breakage of a semiconductor wafer or generation of cracks or scratches on the back surface of the semiconductor wafer during the inspection.

15 Claims, 2 Drawing Sheets

[Fig. 1]
(a)
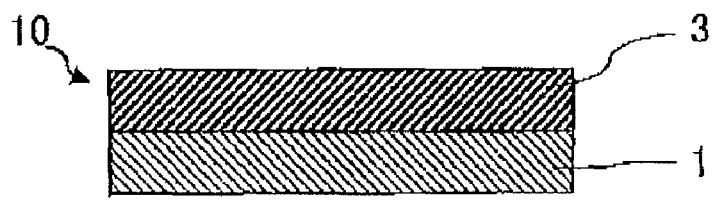
(b)
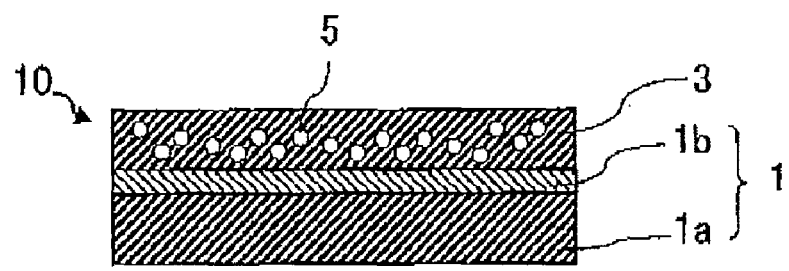
(c)
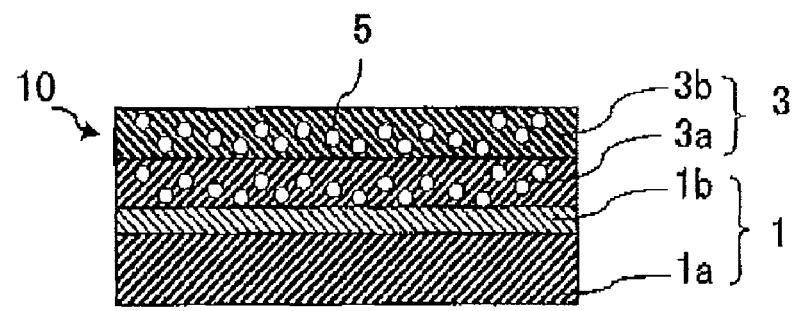

[Fig. 2]
(a)
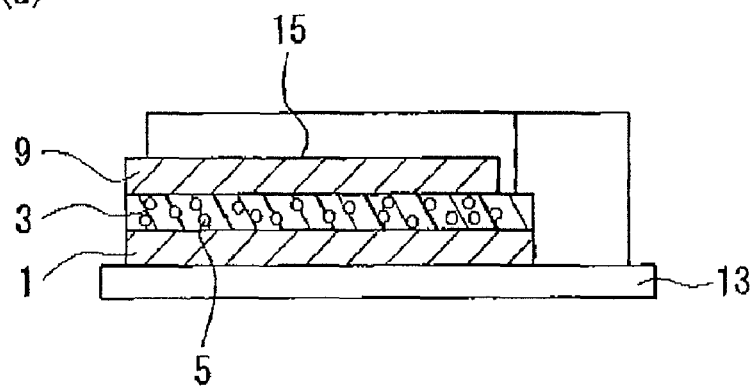
(b)
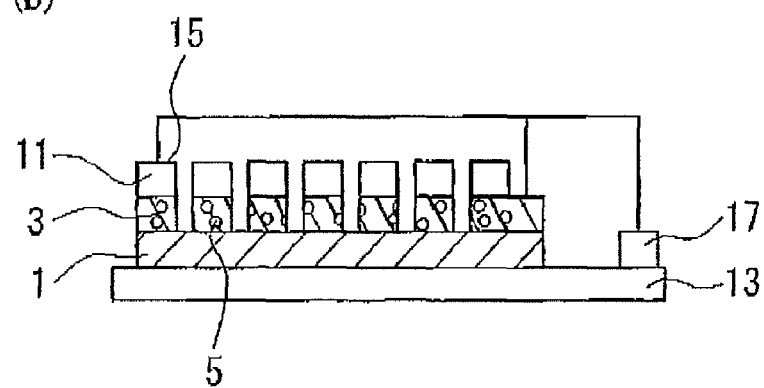

PRESSURE-SENSITIVE ADHESIVE SHEET FOR TESTING

This application is the U.S. National Phase under 35 U.S.C. §371 of International Application No. PCT/JP2008/068338, filed Oct. 9, 2008, which claims priority to the Japanese Patent Application No. 2007-291252, filed Nov. 8, 2007. The International Application has not been published in English under PCT Article 21(2).

TECHNICAL FIELD

The present invention relates to a pressure-sensitive adhesive sheet for testing and a method of manufacturing a semiconductor device using the same. The pressure-sensitive adhesive sheet for testing of the present invention is a pressure-sensitive adhesive sheet for performing a continuity test in a condition where a semiconductor wafer or a semiconductor chip is applied, and it is particularly useful as a pressure-sensitive adhesive sheet that is capable of allowing a dicing step and a picking up step to be performed continuously.

BACKGROUND ART

Conventionally, a semiconductor wafer having silicon, gallium, arsenic, and the like as a material is subjected to a continuity test in a testing step after being manufactured in a condition of having a large diameter. After that, the semiconductor wafer is applied onto a pressure-sensitive adhesive sheet for dicing, and each step of a dicing step, a cleaning step, an expanding step, a picking up step, and a mounting step is performed. An example of the pressure-sensitive adhesive sheet for dicing is one in which a pressure-sensitive adhesive layer made of an acrylic pressure-sensitive adhesive or the like is applied and formed onto a base material of a plastic film (for example, see Patent Document 1).

However, in recent years, semiconductor wafers have become increasingly thin with the spread of IC cards and the like, and because of that, there arises a problem that a semiconductor wafer is deformed (warped) or damaged in the testing step or in the step of applying the wafer onto a pressure-sensitive adhesive sheet for dicing. As a result, it is difficult to steadily handle the semiconductor wafer in these steps. Further, in the case of placing a thin semiconductor wafer onto a stage for the continuity test, there are problems such as flaws and scratches being generated on the backside of the semiconductor wafer and damage (cracks) of the semiconductor wafer being generated by foreign substances, particles, and the like on the stage.

[Patent Document 1] Japanese Examined Patent Publication No. 04-070937

DISCLOSURE OF THE INVENTION

Problems to be Solved by the Invention

The present invention is performed in view of the above-described problems, and an object of the invention is to provide a pressure-sensitive adhesive sheet for testing that is capable of allowing an electrical continuity test to be performed even in a condition where a semiconductor wafer or a semiconductor chip formed by dicing the semiconductor wafer is applied and that is capable of preventing in the test deformation (warp) and damage of the semiconductor wafer and flaws and scratches from being generated on the backside, and a method of manufacturing a semiconductor device using the pressure-sensitive adhesive sheet for testing.

Means for Solving the Problems

The present inventors made a study on a pressure-sensitive adhesive sheet for testing and a method of manufacturing a semiconductor device using the sheet to solve the above-described conventional problems. As a result, the inventors found that the continuity test of a semiconductor wafer or a semiconductor chip becomes possible in a condition where it is fixed to the pressure-sensitive adhesive sheet by using a pressure-sensitive adhesive sheet for testing that includes conductive base film and pressure-sensitive adhesive layer, and completed the present invention.

That is, in order to solve the problems, the pressure-sensitive adhesive sheet for testing according to the present invention is a pressure-sensitive adhesive sheet for testing wherein a pressure-sensitive adhesive layer is provided on a base film, the base film and the pressure-sensitive adhesive layer have conductivity, and an electrically conductive path is provided therebetween.

With the pressure-sensitive adhesive sheet for testing having the above-described configuration, because an electrically conductive path is formed between the pressure-sensitive adhesive layer and the base film, a test related to conductivity can be carried out even in a condition where the semiconductor wafer or the semiconductor chip formed by dicing is fixed (including a temporary fixing). That is, the conductive path is not secured in a conventional pressure-sensitive adhesive sheet for testing because it is not assumed to perform a continuity test on the semiconductor wafer in a condition where the pressure-sensitive adhesive sheet is applied. Because of that, it is difficult to perform the continuity test on the semiconductor wafer. However, because a conductive path is secured between the pressure-sensitive adhesive layer and the base film in the pressure-sensitive adhesive sheet for testing of the present invention, the continuity test becomes possible in a condition where the semiconductor wafer is applied. Further, because the pressure-sensitive adhesive layer can fix the semiconductor wafer in the pressure-sensitive adhesive sheet for testing of the present invention, the sheet also functions as a pressure-sensitive adhesive sheet for dicing. Further, not only the semiconductor wafer but also the pressure sensitive adhesive layer may be cut and separated when dicing. However, even in such a case, the continuity test becomes possible of the semiconductor chip after dicing with the pressure-sensitive adhesive sheet for testing of the present invention because the electrically conductive path is secured between the pressure-sensitive adhesive layer and the base film.

The pressure-sensitive adhesive layer has a laminated structure in which a first conductive pressure-sensitive adhesive layer and a second conductive pressure-sensitive adhesive layer are laminated one by one from the base film side, the adhesive strength of the first conductive pressure-sensitive adhesive layer is 1 N/20 mm or less, the adhesive strength of the second conductive pressure-sensitive adhesive layer is 1 N/20 mm or more, and the adhesive strength of the first conductive pressure-sensitive adhesive layer is preferably smaller than the adhesive strength of the second conductive pressure-sensitive adhesive layer. By setting the surface resistivity in the above-mentioned value range and by making the conductivity of the first conductive pressure-sensitive adhesive layer larger than the conductivity of the second conductive pressure-sensitive adhesive layer as in the aforementioned configuration, the electrically conductive path between the first conductive pressure-sensitive adhesive layer and the second conductive pressure-sensitive adhesive layer is made even better. Further, by making the adhesive strength of the second conductive pressure-sensitive adhesive layer larger than that of the first conductive pressure-sensitive adhesive layer, the semiconductor wafer, the semiconductor chip, or the like can be reliably fixed onto the second conductive pressure-sensitive adhesive layer, and the present invention can be applied suitably to a dicing use as well.

The base film may have a structure in which a conductive deposited layer is provided on the base material.

Further, the base film may also be made of a metal foil.

Further, in the above-described configuration, conductive particles are contained in each of the first conductive pressure-sensitive adhesive layer and the second conductive pressure-sensitive adhesive layer, the content of the conductive particles is in a range of 1 to 500 parts by weight with respect to a base polymer component 100 parts by weight constituting each pressure-sensitive adhesive layer, and the content of the conductive particles in the first conductive pressure-sensitive adhesive layer is preferably larger than the content of the conductive particles in the second conductive pressure-sensitive adhesive layer.

With this configuration, because conductive particles are contained in each of the first and second conductive pressure-sensitive adhesive layers, conductivity can be exhibited in any direction within the surface, in a thickness direction, and the like. Further, because the base film also has conductivity, conductivity is exhibited in any direction within the surface, in the thickness direction, and the like. In this manner, formation of an electrically conductive path becomes possible between the pressure-sensitive adhesive layer and the base film.

By setting the content of the conductive particles in the first and second conductive pressure-sensitive adhesive layers 1 part by weight or more with respect to each base polymer component 100 parts by weight, mutual contact among the conductive particles becomes difficult, so that it is possible to prevent lowering of conductivity. On the other hand, by setting it to 500 parts by weight or less, it is possible to prevent such a situation that an excessively high ratio of the conductive particles in the first and second conductive pressure-sensitive adhesive layers causes lowering in adherability of each layer.

In order to solve above-described problems, a method of manufacturing a semiconductor device according to the present invention includes the steps of applying a semiconductor wafer onto the pressure-sensitive adhesive layer of the pressure-sensitive adhesive sheet for testing described above with a surface opposite a circuit forming surface as an application surface, performing a continuity test on the semiconductor wafer through establishment of an electrical connection by placing the pressure-sensitive adhesive sheet for testing onto a conductive testing stage in a condition where the semiconductor wafer is fixed and by contacting one connection terminal to the circuit forming surface of the semiconductor wafer and contacting another connection terminal to the pressure-sensitive adhesive layer, forming a semiconductor chip in a condition where at least a portion of the base film is left by dicing the semiconductor wafer from the circuit forming surface side, and picking up the semiconductor chip from the pressure-sensitive adhesive sheet for testing.

In the pressure-sensitive adhesive sheet for testing, because an electrically conductive path is formed between the pressure-sensitive adhesive layer and the base film, a continuity test becomes possible even in a condition where the pressure-sensitive adhesive sheet for testing is applied onto the semiconductor wafer. Because a conventional testing step has been performed by directly placing the semiconductor wafer on the testing stage, flaws and scratches have been generated on the backside of the semiconductor wafer and damage (cracks) of the semiconductor wafer has been generated due to foreign substances, particles, and the like that are present on the stage. However, with the above-described method, because the semiconductor wafer is placed on the testing stage in a condition where the semiconductor wafer is fixed onto the pressure-sensitive adhesive sheet for testing (including a temporary fixing), the pressure-sensitive adhesive sheet for testing can also function as a protective sheet. As a result, flaws, scratches, and damages are prevented from being generated on the backside of the semiconductor wafer.

Further, in order to solve the above-described problems, a method of manufacturing a semiconductor device according to the present invention includes the steps of applying a dicing ring and a semiconductor wafer onto the pressure-sensitive adhesive layer of the above-described pressure-sensitive adhesive sheet for testing with a surface opposite a circuit forming surface as an application surface, forming semiconductor chips in a condition where at least a portion of the base film is left by dicing the semiconductor wafer from the circuit forming surface side, performing a continuity test on the semiconductor chips through establishment of an electrical connection by placing the pressure-sensitive adhesive sheet for testing onto a conductive testing stage in a condition where each semiconductor chip right after dicing is fixed and by contacting one connection terminal to the circuit forming surface of the semiconductor chip and contacting another connection terminal to the pressure-sensitive adhesive layer, the dicing ring or the continuity testing stage, and picking up the semiconductor chips from the pressure-sensitive adhesive sheet for testing.

In the pressure-sensitive adhesive sheet for testing, because the electrically conductive path is formed between the pressure-sensitive adhesive layer and the base film, a continuity test becomes possible on each semiconductor chip through establishment of an electrical connection by contacting one connection terminal to the circuit forming surface of the semiconductor chip right after dicing and contacting another connection terminal to the pressure-sensitive adhesive layer, the dicing ring, or the continuity testing stage. As a result, a testing step for the semiconductor wafer before dicing becomes unnecessary, and problems of deformation (warping) and damage of the semiconductor wafer can be avoided.

Further, because the conventional testing step has been performed by directly placing the semiconductor wafer on the testing stage, flaws and scratches have been generated on the backside of the semiconductor wafer and damage (cracks) of the semiconductor wafer has been generated due to foreign substances, particles, and the like that are present on the stage. However, with the above-described method, because each semiconductor chip is placed on the testing stage in a condition where the semiconductor chip is fixed to the pressure-sensitive adhesive sheet for testing (including a temporary fixing), the pressure-sensitive adhesive sheet for testing can also function as a protective sheet. As a result, a semiconductor chip can be manufactured without flaws and scratches on the backside.

Effect of the Invention

The present invention has an effect as described below by the means described above.

That is, because the pressure-sensitive adhesive sheet for testing of the present invention has a configuration in which both the base film and the pressure-sensitive adhesive layer have conductivity and an electrically conductive path is provided therebetween, a continuity test can be performed in a condition where the semiconductor wafer or the semiconductor chip is fixed onto the pressure-sensitive adhesive sheet for testing. As a result, the problems of deformation (warping) and damage of the semiconductor wafer that are conventionally generated in the continuity test can be avoided, and a semiconductor wafer or a semiconductor chip without flaws and scratches on the backside can be manufactured with an improved throughput.

BRIEF DESCRIPTION OF THE DRAWINGS

FIG. 1 is cross-sectional schematic diagrams schematically showing a pressure-sensitive adhesive sheet for testing according to one embodiment of the present invention. FIG. 1(a) shows a case in which conductive particles are contained in a pressure-sensitive adhesive layer, and FIG. 1(b) shows a case in which a portion of the conductive fibers is exposed from the surface of the pressure-sensitive adhesive layer.

FIG. 2 is schematic diagrams for describing a method of manufacturing a semiconductor using the pressure-sensitive adhesive sheet for testing. FIG. 2(a) shows a testing step for a semiconductor wafer, and FIG. 2(b) shows a testing step for a semiconductor chip.

DESCRIPTION OF THE REFERENCE NUMERALS

1 BASE FILM
3 PRESSURE-SENSITIVE ADHESIVE LAYER
5 CONDUCTIVE PARTICLES
9 SEMICONDUCTOR WAFER
10 PRESSURE-SENSITIVE ADHESIVE SHEET FOR TESTING
11 SEMICONDUCTOR CHIP
13 CONTINUITY TESTING STAGE
15 CIRCUIT FORMING SURFACE
17 DICING RING

BEST MODE FOR CARRYING OUT THE INVENTION

An embodiment of the present invention is described below with reference to FIG. 1. FIG. 1 is cross-sectional schematic diagrams schematically showing a pressure-sensitive adhesive sheet for testing (hereinafter referred to as a "pressure-sensitive adhesive sheet") according to the present embodiment. However, parts that are not necessary for the description are not shown, and there are parts represented in, e.g., an enlarged or reduced manner to simplify the description.

As shown in FIG. 1(a), a pressure-sensitive adhesive sheet according to the present invention has a configuration in which a pressure-sensitive adhesive layer 3 is provided on a base film 1. Each of the base film 1 and the pressure-sensitive adhesive layer 3 has conductivity, and an electrically conductive path is provided therebetween.

The base film 1 may, for example, have a structure in which a conductive deposited layer 1b is provided on a base material 1a as shown in FIG. 1(b). The base material 1a is not particularly limited, and typical materials thereof include polyolefins such as low density polyethylene, linear polyethylene, medium density polyethylene, high density polyethylene, ultralow density polyethylene, random copolymer polypropylene, block copolymer polypropylene, homopolypropylene, polybutene, and polymethylpentene, polyesters such as an ethylene-vinyl acetate copolymer, an ionomer resin, an ethylene-(meth)acrylate copolymer, an ethylene-(meth)acrylate ester (random, alternating) copolymer, an ethylene-butene copolymer, and ethylene-hexene copolymer, polyurethane, and polyethylene terephthalate, polyimide, polyether ketone, polystyrene, polyvinyl chloride, polyvinylidene chloride, a fluoro resin, a silicone resin, a cellulose based resin, and polymers of crosslinking bodies of these. Moreover, the above-described exemplified materials may be used by grafting functional groups, functional monomers, and modified monomers as needed.

Moreover, the base material 1a may be either a single layer film or a multilayer film, and may be a blend film in which two kinds or more of the above-mentioned resins are blended. The multilayer film can be manufactured with a traditional film laminating method such as a coextrusion method and a dry laminating method using the above-mentioned resins. Further, the plastic film may be used unoriented, or a uniaxial or biaxial stretching treatment may be carried out as needed. A traditional physical or chemical treatment such as a matting treatment, a corona discharge treatment, a primer treatment, and a crosslinking treatment may be carried out as needed on the surface of the plastic film thus manufactured.

The thickness (total thickness in the case of a multilayer film) of the base material 1a is normally 10 to 300 μm, and preferably about 30 to 200 μm.

The conductive deposited layer 1b is not particularly limited, and is, for example, an aluminum-deposited film.

Further, the thickness of the conductive deposited layer 1b is preferably 1 nm to 10 μm, and more preferably 10 nm to 1 μm.

The conductivity of the conductive deposited layer 1b is not particularly limited as long as it is in a range that allows for a continuity test. The range that allows for a continuity test is specifically that the surface resistivity is 5 Ω/□ or less, preferably 1 Ω/□ or less, and especially preferably $5 \times 10^{-1}$ Ω/□ or less. When the surface resistivity exceeds 5 Ω/□, the conductivity in a direction within the surface lowers, and the continuity test may become difficult. Moreover, the lower limit is preferably $1 \times 10^{-4}$ Ω/□ or more from a practical viewpoint. Further, the volume resistivity is $1 \times 10^{-1}$ Ω·cm or less, preferably $1 \times 10^{-2}$ Ω·cm or less, and especially preferably $1 \times 10^{-3}$ Ω·cm or less. When the volume resistivity exceeds $1 \times 10^{-1}$ Ω·cm, the conductivity lowers and a problem may be caused in the continuity test. Moreover, the lower limit is preferably $1 \times 10^{-7}$ Ω·cm or more from a practical viewpoint. The conductivity evaluation is performed according to JIS K7194 using Lorester MP MCP-T 350 manufactured by Mitsubishi Chemical Corporation, and the conductivity can be obtained by measuring the surface of the conductive deposited layer 1b. At this time, calculation of the surface resistivity and the volume resistivity is performed based on a resistivity correction factor RCF of 4.532. Moreover, the volume resistivity is calculated by inputting the film thickness of the base film.

Further, the base film 1 of the present invention is not limited to the above-described configuration, and it may be made of, for example, a metal foil. By using a metal foil, rigidity can be given to the base film 1. Exemplary constituting materials of the metal foil include copper. The thickness of the base film 1 in the case of using a metal foil is normally, but not limited to, 10 to 300 μm, preferably 30 to 200 μm, and especially preferably 50 to 150 μm.

The pressure-sensitive adhesive layer 3 is not particularly limited as long as electrical conduction is ensured at least in the thickness direction by inclusion of conductive particles.

The conductivity of the pressure-sensitive adhesive layer 3 is obtained from a structure in which the conductive particles are dispersed in a mutually contacting condition.

The condition in which the conductive particles 5 are contacting one another at least in the film thickness direction provides conductivity in that direction. As a result, an electrically conductive path with the base film 1 can be secured even when the pressure-sensitive adhesive layer 3 is completely cut and separated by dicing. Moreover, in the case of providing conductive anisotropy that shows conductivity only, for example, in the film thickness direction, the conductive particles 5 may be dispersed in such a way as to mutually contact one another only in the thickness direction by dispersing the conductive particles in the pressure-sensitive adhesive layer 3 in a condition where the conductive particles 5 are separated from one another and then compressing the film in the film thickness direction to a predetermined film thickness.

The pressure-sensitive adhesive layer 3 may have conductivity in a range that a continuity test is possible. The conductivity of the pressure-sensitive adhesive sheet 10 that permits a continuity test is specifically such that the surface resistivity on its surface is $1 \times 10^3$ Ω/□ or less, preferably $5 \times 10^2$ Ω/□ or less, and especially preferably $1 \times 10^2$ Ω/□ or less. Moreover, the lower limit is preferably $1 \times 10^{-3}$ Ω/□ or more from a practical viewpoint. Further, the volume resistivity of the pressure-sensitive adhesive layer 3 is 1 Ω·cm or less, preferably $1 \times 10^{-1}$ Ω·cm or less, and especially preferably $1 \times 10^{-2}$ Ω·cm or less. Moreover, the lower limit is preferably $1 \times 10^{-5}$ Ω·cm or more from a practical viewpoint. The conductivity evaluation is performed according to JIS K7194 using Lorester MP MCP-T350 manufactured by Mitsubishi Chemical Corporation, and the conductivity can be obtained by measuring the surface of the pressure-sensitive adhesive of the pressure-sensitive adhesive sheet 10. At this time, calculation of the surface resistivity and the volume resistivity is performed based on a resistivity correction factor RCF of 4.532. Further, the volume resistivity is calculated by inputting the film thickness of the pressure-sensitive adhesive sheet 10.

The content of the conductive particles 5 is 1 to 500 parts by weight with respect to the base polymer component 100 parts by weight constituting the pressure-sensitive adhesive layer 3, preferably 5 to 500 parts by weight, and especially preferably to 200 parts by weight. When the content is less than 1 part by weight, mutual contact among the conductive particles 5 becomes difficult and the conductivity may be lowered. On the other hand, when the content exceeds 1000 parts by weight, the ratio of the conductive particles occupying the pressure-sensitive adhesive layer 3 becomes too high, and the adherability may degrade.

The type of the conductive particles 5 used in the present invention is not particularly limited, and examples include metal particles such as nickel, gold, silver, copper, aluminum, solder, and platinum, metal oxide particles such as ITO (indium-tin oxide), ATI, titanium oxide, tin oxide, copper oxide, and nickel oxide, carbon particles such as diamond, carbon black, carbon tube, and carbon fiber, and a composite conductive particles in which the surface of a plastic particle such as polystyrene is covered with a conductive layer. Further, the shape of these conductive particles 5 is not particularly limited, and examples include a sphere shape, a needle shape, a fiber shape, a flake shape, a spike shape, and a coil shape.

Furthermore, the size of the conductive particles 5 is not particularly limited, and for example, the particle diameter is 100 μm or less, preferably 1 nm to 100 μm, and especially preferably 10 nm to 50 μm. In the case where the particle diameter exceeds 100 μm, variation in film thickness and surface unevenness of the pressure-sensitive adhesive layer 3 becomes large, and there may be a case in which the dicing property lowers. The particle diameter is a value measured according to a BET method.

Further, the pressure-sensitive adhesive layer 3 may have a structure in which a first conductive pressure-sensitive adhesive layer 3a and a second conductive pressure-sensitive adhesive layer 3b are laminated one by one from the base film 1 side (see FIG. 1(c)). In this case, the surface resistivity of the first conductive pressure-sensitive adhesive layer 3a is preferably $1 \times 10^{-2}$ to 1 Ω/□, and the surface resistivity of the first conductive pressure-sensitive adhesive layer 3b is preferably $1 \times 10^{-1}$ to $1 \times 10^1$ Ω/□. In this manner, the electrically conductive path therebetween is made even better. The surface resistivity is a value measured with the above-described measurement method by forming the pressure-sensitive adhesive layer on a copper foil film of 25 μm thickness.

Further, the adhesive strength of the first conductive pressure-sensitive adhesive layer 3a is 1 N/20 mm or less, preferably 0 to 1 N/20, the adhesive strength of the second conductive pressure-sensitive adhesive layer 3b is 1 N/20 mm or more, preferably 1 to 10 N/20 mm, and the adhesive strength of the second conductive pressure-sensitive adhesive layer 3b is preferably larger than the adhesive strength of the first conductive pressure-sensitive adhesive layer 3a. By making the adhesive strength of the second conductive pressure-sensitive adhesive layer 3b larger than that of the first conductive pressure-sensitive adhesive layer 3a, the semiconductor wafer or the semiconductor chip that is applied onto the second conductive pressure-sensitive adhesive layer 3b can be reliably fixed, and it can also be suitably applied to a dicing use. The adhesive strength is based on the adhesive strength (90 degree peel value, peeling speed 300 mm/min.) relative to a silicon wafer at a normal temperature. The reasons why the adhesive strength is defined by using a silicon mirror wafer are that the roughness condition of the surface of the silicon mirror wafer is smooth to a certain degree and that the silicon mirror wafer is constituted of a homogeneous material as the semiconductor wafer, and the like serving as a workpiece to be diced and picked up. Further, the reason why the adhesive strength at the measurement temperature 23±3° C. is set to a standard is that picking up is performed normally at a room temperature (23° C.).

The thickness of the first conductive pressure-sensitive adhesive layer 3a is preferably 5 to 100 μm and more preferably 20 to 50 μm. When the thickness of the first conductive pressure-sensitive adhesive layer 3a is less than 5 μm, there is a case in which the base film 1 is cut when stopping the dicing at the first conductive pressure-sensitive adhesive layer without cutting into to the base film in dicing. On the other hand, when the thickness of the first conductive pressure-sensitive adhesive layer 3a exceeds 100 μm, the compounding amount of the conductive particles needs to be increased to secure the conductivity, which is not preferable. Furthermore, vibration that occurs during dicing of the semiconductor wafer becomes excessively large, and there is a case in which breaking (chipping) of the semiconductor chip occurs.

The thickness of the second conductive pressure-sensitive adhesive layer 3b is preferably 1 to 30 μm, and more preferably, 3 to 20 μm. If the thickness of the second conductive pressure-sensitive adhesive layer 3b is less than 1 μm, the adhesive strength is low, and the semiconductor chip is insufficiently held during dicing, leading to a chip fly. On the other hand, if the thickness of the second conductive pressure-sensitive adhesive layer 3b exceeds 30 μm, the compounding amount of the conductive particles needs to be increased in order to secure the conductivity, which is not preferable. Further, vibration that occurs during dicing of the semiconductor wafer may become excessively large, and breaking (chipping) of the semiconductor chip may occur.

The content of the conductive particles contained in the first conductive pressure-sensitive adhesive layer 3a and the second conductive pressure-sensitive adhesive layer 3b is 1 to 500 parts by weight with respect to the base polymer component 100 parts by weight constituting each of the pressure-sensitive adhesive layers, preferably 5 to 500 parts by weight, and especially preferably 10 to 200 parts by weight. When the content is less than 1 part by weight, mutual contact among the conductive particles 5 becomes difficult, and the conductivity may lower. On the other hand, when the content exceeds 500 parts by weight, the ratio of the conductive particles occupying the pressure-sensitive adhesive layer 3 becomes too high, and the adherability may degrade. However, the content of the conductive particles in the first conductive pressure-sensitive adhesive layer 3a is preferably larger than the content of the conductive particles in the second conductive pressure-sensitive adhesive layer 3b. In this manner, the conductivity of the first conductive pressure-sensitive adhesive layer 3a can be made larger than the conductivity of the second conductive pressure-sensitive adhesive layer 3b, and the adhesive strength of the first conductive pressure-sensitive adhesive layer 3a can be made smaller than the adhesive strength of the second conductive pressure-sensitive adhesive layer 3b.

Moreover, the conductive particles to be contained in each of the first conductive pressure-sensitive adhesive layer 3a and the second conductive pressure-sensitive adhesive layer 3b may be the same material or may be a different material appropriately as needed. Further, the shape of the particles and the particle diameter may be different even if the same material is used.

A known pressure-sensitive adhesive containing a (meth) acrylic polymer, a rubber polymer, or the like may be used as a forming material of the pressure-sensitive adhesive layer 3. In particular, an acrylic pressure-sensitive adhesive having an acrylic polymer as a base polymer is preferred in view of, e.g., contamination to the semiconductor wafer.

Examples of the monomer component forming the (meth) acrylic polymer are alkyl(meth)acrylates having a linear or a branched alkyl group having 30 or less carbon number, preferably 4 to 18 carbon number, such as a methyl group, an ethyl group, an n-propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group. These alkyl (meth)acrylates may be used alone, or two or more of them may be used.

Examples of the monomer component other than the above include a carboxyl group-containing monomer such as acrylic acid, methacrylic acid, carboxyethyl(meth)acrylate, carboxypentyl(meth)acrylate, itaconic acid, maleic acid, fumaric acid, and crotonic acid, an acid anhydride monomer such as maleic anhydride and itaconic anhydride, a hydroxyl group-containing monomer such as 2-hydroxyethyl(meth) acrylate, 2-hydroxypropyl(meth)acrylate, 4-hydroxybutyl (meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)methyl (meth)acrylate, a sulfonic acid group-containing monomer such as styrenesulfonic acid, allylsulfonic acid, 2-(meth)acrylamide-2-methylpropanesulfonic acid, (meth)acrylamidepropanesulfonic acid, sulfopropyl(meth) acrylate, and (meth)acryloyloxynaphthalenesulfonic acid, and a phosphate group-containing monomer such as 2-hydroxyethylacryloylphosphate. These monomer components may be used alone, or two or more of them may be used.

Further, a multifunctional monomer and the like may be used as a copolymerization monomer component as needed for the purpose of a crosslinking treatment or the like of the (meth) acrylic polymer.

Examples of the multifunctional monomer include hexanediol di(meth)acrylate, (poly)ethylene glycol di(meth) acrylate, (poly)propylene glycol di(meth)acrylate, neopentyl glycol di(meth)acrylate, pentaerythritol di(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythritol hexa(meth) acrylate, epoxy(meth)acrylate, polyester(meth)acrylate, and urethane(meth)acrylate. These multifunctional monomers may be used alone, or two or more of them may be used.

The amount used of the multifunctional monomer is preferably 30% by weight or less of all the monomer components from the viewpoint of, e.g., adhesive characteristics, and more preferably 15% by weight or less.

Preparation of the (Meth) Acrylic Polymer can be Performed by adopting an appropriate method such as a solution polymerization method, an emulsion polymerization method, a bulk polymerization method, or a suspension polymerization method on a mixture containing one type or two types or more of the monomer components.

Exemplary polymerization initiators include a peroxide based initiator such as hydrogen peroxide, benzoyl peroxide, and t-butyl peroxide. The polymerization initiator is preferably used alone, but it can be used as a redox system polymerization initiator in combination with a reducing agent. Exemplary reducing agents include an ionized salt such as sulfite, bisulfite, iron salt, copper salt, and cobalt salt, amines such as triethanolamine, and a reducing sugar such as aldose and ketose. Further, an azo compound is also a preferred polymerization initiator, and 2,2'-azobis-2-methylpropioamidinate, 2,2'-azobis-2,4-dimethylvaleronitrile, 2,2'-azobis-N, N'-dimethyleneisobutylamidinate, 2,2'-azobisisobutylonitrile, and 2,2'-azobis-2-methyl-N-(2-hydroxyethyl) propionamide, or the like may be used. Further, two types or more of the above-described polymerization initiator can be also used.

The reaction temperature is normally about 50 to 85° C., and the reaction time is about 1 to 8 hours. Further, among the above-mentioned manufacturing methods, the solution polymerization method is preferred, and a polar solvent such as ethyl acetate and toluene is generally used as a solvent of the (meth) acrylic polymer. The solution concentration is normally about 20 to 80% by weight.

A crosslinking agent may be appropriately added to the pressure-sensitive adhesive to increase the number average molecular weight of the (meth) acrylic polymer that is the base polymer. Exemplary crosslinking agents include a polyisocyanate compound, an epoxy compound, an aziridine compound, a melamine resin, a urea resin, an anhydride compound, polyamine, and a carboxyl group-containing polymer. In the case of using the crosslinking agent, the amount used thereof is preferably about 0.01 to 5 parts by weight with respect to the base polymer 100 parts by weight, considering that the adhesive strength for peeling off does not become too low. Further, traditional additives such as various conventionally known tackifier, antioxidant, filler, antioxidant, and coloring agents may be contained in the pressure-sensitive adhesive forming the pressure-sensitive adhesive layer 3 besides the above-described components as needed.

In order to improve the peeling property from the semiconductor chip, the pressure-sensitive adhesive is preferably a radiation curing type pressure-sensitive adhesive that is cured by radiation such as ultraviolet rays and electron beams. In the case of using a radiation curing type pressure-sensitive adhesive, because the adhesive strength of the pressure-sensitive adhesive layer 3 lowers due to radiation irradiation (for example, ultraviolet rays), the peeling of the pressure-sensitive adhesive sheet can be performed easily by radiating the radiation onto the pressure-sensitive adhesive layer 3. Moreover, in the case of using a radiation curing type pressure-sensitive adhesive as the pressure-sensitive adhesive, the above-described conductive fiber base material having an aperture of 10% or more is preferably used.

The radiation curing type pressure-sensitive adhesive having a radiation curable functional group such as a carbon-carbon double bond and that exhibits adherability can be used without particular limitation. Exemplary radiation curing type pressure-sensitive adhesives include a radiation curing type pressure-sensitive adhesive in which a radiation curable monomer component and oligomer component are included in the above-described (meth)acrylic polymer.

Exemplary compounding radiation curable monomer components and oligomer components include urethane (meth)acrylate, trimethyloipropane tri(meth)acrylate, tetramethylolmethane tetra(meth)acrylate, pentaerythritol tri(meth)acrylate, pentaerythritol tetra(meth)acrylate, dipentaerythritol monohydroxy penta(meth)acrylate, dipentaerythiritol hexa(meth)acrylate, and 1,4-butylene glycol di(meth)acrylate. These may be used alone, or two or more types may be used.

The compounding amount of the radiation curable monomer component and oligomer component is not particularly limited. However, it is preferably about 5 to 500 parts by weight with respect to the base polymer 100 parts by weight of, e.g., the (meth) acrylic polymer constituting the pressure-sensitive adhesive considering adherability, and more preferably about 60 to 150 parts by weight.

Further, in the radiation curing type pressure-sensitive adhesive, a polymer having a carbon-carbon double bond in a polymer side-chain, in a main chain, or at the end of the main chain can be used as the base polymer. Such a base polymer preferably has a (meth)acrylic polymer as a basic skeleton. In this case, the radiation curable monomer component and oligomer component do not have to be added and they are optionally used.

A photopolymerization initiator is contained in the radiation curing type pressure-sensitive adhesive in the case of curing using ultraviolet rays, and the like. Exemplary photopolymerization initiators include an acetophenone compound such as 4-(2-hydroxyethoxy)phenyl(2-hydroxy-2-propyl)ketone, α-hydroxy-α,α-methylacetophenone, methoxyacetophenone, 2,2-dimethoxy-2-phenylacetophenone, 2,2-diethoxyacetophenone, 1-hydroxycyclohexylphenylketone, and 2-methyl-1-[4-(methylthio)phenyl]-2-morpholinopropane-1, a benzoin ether compound such as benzoin ethyl ether, benzoin isopropyl ether, and anizoin methyl ether, an α-ketol compound such as 2-methyl-2-hydroxypropylphenone, a ketal compound such as benzyldimethylketal, an aromatic sulfonyl chloride compound such as 2-naphthalenesulfonylchloride, a photoactive oxime compound such as 1-phenone-1,1-propanedion-2-(o-ethoxycarbonyl)oxime, a benzophenone compound such as benzophenone, benzoyl benzoic acid, and 3,3'-dimethyl-4-methoxybenzophenone, a thioxanthone compound such as thioxanthone, 2-chlorothioxanthone, 2-methylthioxanthone, 2,4-dimethylthioxanthone, isopropyl thioxanthone, 2,4-dichlorothioxanthone, 2,4-diethylthioxanthone, and 2,4-diisopropylthioxanthone, camphorquinone, ketone halide, acylphosphinoxide, and acylphosphonate.

The compounding amount of the photopolymerization initiator is preferably about 0.1 to 10 parts by weight with respect to the base polymer 100 parts by weight of, e.g., the (meth)acrylic polymer constituting the pressure-sensitive adhesive, and more preferably about 0.5 to 10 parts by weight.

Further, the thickness of the pressure-sensitive adhesive layer 3 is not particularly limited and may be equal to the conventional pressure-sensitive adhesive sheet for dicing. Specifically, it is 1 to 50 μm, preferably 3 to 20 μm, and especially preferably 5 to 20 μm. When the thickness is less than 1 μm, the adhesive strength is low, the semiconductor chip is held insufficiently during dicing, and a chip fly may occur. On the other hand, when the thickness exceeds 50 μm, the compounding amount of the conductive particles needs to be increased to secure the conductivity of the pressure-sensitive adhesive layer 3, which is not preferable. Furthermore, vibration that occurs during dicing of the semiconductor wafer becomes excessively large, and breaking (chipping) of the semiconductor chip may occur.

Further, in the pressure-sensitive adhesive sheet 10, a separator is preferably provided on the pressure-sensitive adhesive layer 3. By providing the separator, heat treatment can be performed on the laminated sheet (the pressure-sensitive adhesive sheet) and the sheet can be stored by forming it into a roll shape. Further, the surface of the pressure-sensitive adhesive layer 3 can be protected from dust, and the like until the pressure-sensitive adhesive sheet 10 is used.

Exemplary constituting materials of the separator include polyether ether ketone, polyetherimide, polyarylate, polyethylene naphthalate, and a plastic film such as a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, an ethylene-vinylacetate copolymer film, an ionomer resin film, an ethylene(meth)acrylate copolymer film, and ethylene-(meth)acrylate ester copolymer film, a polystyrene film, and a polycarbonate film.

A peeling treatment such as a silicone treatment, a long-chain alkyl treatment, and a fluorine treatment may be carried out on one side of the separator to improve the peeling property from the pressure-sensitive adhesive layer 3 as needed. Further, an ultraviolet ray anti-transmission treatment or the like may be also carried out as needed so that the pressure-sensitive adhesive sheet 10 does not react with the environmental ultraviolet ray. The thickness of the separator is normally 5 to 200 μm, preferably 25 to 100 μm, and further preferably 38 to 60 μm.

A surface that is satin-finished or having an uneven structure can be used as the surface that does not contact the pressure-sensitive adhesive layer 3 of the separator.

The pressure-sensitive adhesive sheet 10 can be manufactured, for example, by forming the pressure-sensitive adhesive layer 3 on the separator and then applying these onto the base film 1. Further, the sheet can be also manufactured by separately forming the pressure-sensitive adhesive layer 3 by directly applying the pressure-sensitive adhesive solution over the surface of the base film 1 and drying it (by heat-crosslinking as needed) and by applying the separator onto the surface of this pressure-sensitive adhesive layer 3 as needed. One or two or more layers of the pressure-sensitive adhesive layer 3 may be laminated.

The laminated sheet in which the separator is provided on the pressure-sensitive adhesive layer 3 is made into a roll and is preferably subjected to heat treatment. The characteristics of the pressure-sensitive adhesive can be stabilized by heat treatment on the laminated sheet. The temperature in the heat treatment is about 30 to 60° C., and the treatment time is about 12 to 100 hours.

The pressure-sensitive adhesive sheet 10 may have an appropriate shape such as a sheet-like shape and a roll-like shape depending on use. For wafer dicing use, for example, a sheet that is cut and processed into a required shape in advance is preferably used. Further, the outer diameter of the pressure-sensitive adhesive sheet 10 may be larger than the outer diameter of the semiconductor wafer and may be smaller than the inner diameter of the dicing ring.

Further, the adhesive strength of the pressure-sensitive adhesive layer 3 is preferably 20 N/20 mm or less based on the adhesive strength (90 degree peel value, peeling speed 300 mm/min.) relative to a silicon wafer at a normal temperature, more preferably 0.001 to 10 N/20 mm, and especially preferably 0.01 to 8 N/20 mm. The reasons why the adhesive strength of the pressure-sensitive adhesive layer 3 is defined by using a silicon mirror wafer are that the roughness condition of the surface of the silicon mirror wafer is smooth to a certain degree and that the silicon mirror wafer is constituted of a homogeneous material as the semiconductor wafer and the like serving as a workpiece to be diced and picked up. Further, the reason why the adhesive strength at the measurement temperature 23±3° C. is set to a standard is that picking up is performed normally at a room temperature (23° C.).

The pressure-sensitive adhesive layer 3 preferably has a peeling property such that the increased amount ΔC of organic contaminants on the surface becomes 5% or less on the application surface of the semiconductor wafer made of silicon. With the pressure-sensitive adhesive layer 3 having such a peeling property, generation of an adhesive residue on the semiconductor chip after picking up can be reduced. The value of the increased amount ΔC (%) of organic contaminants on the surface is the value obtained by subtracting the value C2 (%) of the amount of organic contaminants on the surface of the semiconductor wafer from the value C1 (%) of the amount of organic contaminants on the surface of the semiconductor wafer when the pressure-sensitive adhesive sheet is peeled at 23° C. after dicing and right before picking up the semiconductor wafer. Further, in the case where the pressure-sensitive adhesive layer 3 contains the radiation curing type pressure-sensitive adhesive, the increased amount ΔC of organic contaminants on the surface shows a value when the sheet is peeled after irradiation of radiation.

In the pressure-sensitive adhesive sheet 10 according to the present invention, the adhesive strength for peeling off during picking up is controlled to be low or is set to be able to be controlled as described above. However, when the adhesive strength is low, a chip that is cut and separated cannot be held when performing dicing that is a pre-step, and there is a high possibility of the chip being peeled off from the pressure-sensitive adhesive sheet 10 during dicing (chip fly occurs). Because of that, a pressure-sensitive adhesive sheet is preferably used which is, by forming the pressure-sensitive adhesive layer 3 from a radiation curing type pressure-sensitive adhesive that is capable of reducing the adhesive strength through radiation irradiation, capable of reducing the adhesive strength by radiation irradiation after the dicing step while maintaining the adhesive strength at a certain level during dicing. Further, from the same viewpoint, it is also suitable that the pressure-sensitive adhesive layer be formed from a heat foaming-peeling type pressure-sensitive adhesive that is capable of reducing the adhesive strength by heating. In such a case, the adhesive strength is reduced by applying a known operation such as heating after dicing, and then picking up can be performed.

Next, a method of manufacturing a semiconductor device according to the present invention is described. The semiconductor device manufacturing method of the present invention includes a mounting step of applying the semiconductor wafer onto the pressure-sensitive adhesive layer 3 of the pressure-sensitive adhesive sheet 10, a testing step for the semiconductor wafer or the semiconductor chip, a dicing step of dicing the semiconductor wafer, and a picking up step of picking up the semiconductor chip. With the pressure-sensitive adhesive sheet 10 according to the present invention, a continuity testing step can be performed even in a condition where the semiconductor wafer is applied as described above. Therefore, the continuity testing step may be performed on the semiconductor wafer before the dicing step, or the continuity testing step may be performed on each semiconductor chip after the dicing step. Moreover, the manufacturing method of the present invention can be suitably adopted in the case where the thickness of the semiconductor wafer is less than 100 μm, and further less than 50 μm.

The above-described mounting step is performed by superposing the semiconductor wafer and the pressure-sensitive adhesive sheet so that the backside of the semiconductor wafer (the surface opposite the circuit forming surface) and the pressure-sensitive adhesive layer 3 side become the application surfaces and by pressing them with pressing means such as a pressing roll. Further, the semiconductor water and the pressure-sensitive adhesive sheet 10 may be applied by superposing them as described above in a container that is capable of being pressurized (such as an autoclave) and pressurizing the inside of the container. At this time, application may be performed through pressing with the pressing means. Further, application may be performed in the same manner as described above in a vacuum chamber. The application temperature for application is not limited at all. However, it is preferably 20 to 80° C.

In the case of performing the continuity test on a semiconductor wafer 9 before the dicing step, this semiconductor wafer 9 is placed on a continuity testing stage 13 in a condition where the pressure-sensitive adhesive sheet 10 is applied (see FIG. 2(a)). Next, a conductive path is secured by contacting one of the terminals for the continuity test to a circuit forming surface (electrode) 15 of the semiconductor wafer 9 and by contacting another terminal to the pressure-sensitive adhesive layer 3 or the continuity testing stage 13. After that, a predetermined voltage is applied between the terminals, and the conduction of the circuit formed in the semiconductor wafer 9 is confirmed based on the resistance value.

The above-described dicing step is a step of forming semiconductor chips by cutting (dicing) the semiconductor wafer 9. The dicing is performed according to a normal method from the circuit surface side of the semiconductor wafer, and a known method may be used such as blade dicing, laser dicing, plasma dicing, and breaking. Further, a cutting method called full-cut method that cuts into to the pressure-sensitive adhesive sheet 10 may be adopted as the cutting method. In the present invention, because the conductive path is secured between the base film 1 and the pressure-sensitive adhesive layer 3 of the pressure-sensitive adhesive sheet 10, the continuity testing step for a semiconductor chip that is described later can be performed even in the case where the pressure-sensitive adhesive layer 3 is completely cut and a portion of the base film 1 is cut. The dicing apparatus used in the present step is not particularly limited, and a conventional known apparatus may be used.

In the case of performing the continuity test on the semiconductor chip 11 after the dicing step, each semiconductor chip 11 is placed on the continuity testing stage 13 in a condition where each semiconductor chip 11 is applied onto the pressure-sensitive adhesive sheet 10 (see FIG. 2(b)). Next, a conductive path is secured by contacting one of the terminals for the continuity test to a circuit forming surface (electrode) 15 of each semiconductor chip 11 and by contacting another terminal to the pressure-sensitive adhesive layer 3, the dicing ring 17, or the continuity testing stage 13. After that, a predetermined voltage is applied between the terminals, and the conduction of each semiconductor chip 11 is confirmed based on the resistance value. Moreover, in the case where the pressure-sensitive adhesive layer 3 is completely cut in the dicing step, the other terminal is contacted to the continuity testing stage 13. Because the pressure-sensitive adhesive sheet 10 has a structure in which the conductive path is secured between the base film 1 and the pressure-sensitive adhesive layer 3, the continuity test becomes possible even when the pressure-sensitive adhesive layer 3 is completely cut and a portion of the base film 1 is cut into. The dicing ring 17 preferably has conductivity.

The picking up step is performed for peeling the semiconductor chip 11 that is bonded and fixed to the pressure-sensitive adhesive sheet 10. The method of picking up is not particularly limited, and various conventionally known methods may be adopted. Exemplary methods include a method of thrusting an individual semiconductor chip 11 from the side of the pressure-sensitive adhesive sheet 10 using a needle and picking up the thrust semiconductor chip 11 by a pick-up apparatus.

In the case of using the pressure-sensitive adhesive sheet having a radiation curing type pressure-sensitive adhesive layer or a heat peeling type pressure-sensitive adhesive layer, radiation irradiation or a heat treatment may be carried out on the pressure-sensitive adhesive layer 3. In this manner, the adherability is reduced to facilitate picking up. In the case of a pressure-sensitive adhesive layer 3 of a radiation curing type, conditions such as radiation intensity and a radiation time during radiation irradiation are not particularly limited and may be appropriately set as needed. Further, in the case of a pressure-sensitive adhesive layer 3 of a heat peeling type, when heated, the pressure-sensitive adhesive layer 3 expands due to the heat foaming component or the heat expanding component and the bonding area with the semiconductor chip 11 can be remarkably decreased. In this manner, the adhesive strength of the pressure-sensitive adhesive sheet 10 to the semiconductor chip lowers, and the pressure-sensitive adhesive sheet 10 is easily peeled from the semiconductor chip 11. As a result, picking up becomes possible without damaging the semiconductor chip 11. The heating conditions such as the heating temperature and the heating time in the case of performing the heat treatment are not particularly limited and may be appropriately set as needed.

EXAMPLE

Preferred examples of this invention are described for illustrative purpose in detail below. However, the materials, the compounding amount, and the like described in the examples are merely illustrative and not for the purpose of limiting the scope of this invention as long as there is no particularly restrictive description.

Example 1

A solution containing an acrylic polymer having a number average molecular weight of 800,000 was obtained by copolymerizing methyl acrylate 70 parts by weight, butyl acrylate 30 parts by weight, and acrylic acid 5 parts by weight in ethyl acetate. An ultraviolet-ray curing-type acrylic pressure-sensitive adhesive was prepared by adding dipentaerythritol hexacrylate (KAYARAD DPHA manufactured by Nippon Kayaku Co., Ltd.) 60 parts by weight, a radical polymerization initiator (IRGACURE 651 manufactured by Ciba Specialty Chemicals) 5 parts by weight, and a polyisocyanate compound (Coronate L manufactured by Nippon Polyurethane Industry) 2 parts by weight into this solution. A conductive pressure-sensitive adhesive solution A was produced by adding nickel powder manufactured by Inco Special Products (trade name Type 123, a spike shape, particle diameter 3 to 7 μmϕ) 200 parts by weight into this pressure-sensitive adhesive solution as the conductive particles.

Each of the ultraviolet ray curing-type pressure-sensitive adhesive layers (the first conductive pressure-sensitive adhesive layer) for evaluating the conductivity and for measuring the 90 degree peeling-off adhesive strength was formed using this conductive pressure-sensitive adhesive solution A. An ultraviolet-ray curing-type pressure-sensitive adhesive layer having a thickness of 25 μm was formed by applying the conductive pressure-sensitive adhesive solution A onto a copper foil having a thickness of 25 μm for evaluating the conductivity and a polyester film having a thickness of 25 μm for measuring the 90 degree peeling-off adhesive strength, and subjected to heat-crosslinking at 80° C. for 10 minutes. Next, a separator was applied onto each of the ultraviolet-ray curing-type pressure-sensitive adhesive layers, and then the pressure-sensitive adhesive was cured by performing ultraviolet ray irradiation (1000 mJ/cm$^2$).

Then, the surface resistivity and the volume resistivity of the ultraviolet-ray curing-type pressure-sensitive adhesive layer for evaluating the conductivity were measured with a measurement method described later. As a result, the surface resistivity was $2.6 \times 10^{-1}$ Ω/□, and the volume resistivity was $7.9 \times 10^{-4}$ Ω·cm. Further, the 90 degree peeling-off adhesive strength of the ultraviolet-ray curing-type pressure-sensitive adhesive layer for measuring the 90 degree peeling-off adhesive strength was measured in a thermostatic chamber at 23±3° C. with a measurement method described later. As a result, the 90 degree peeling-off adhesive strength was 0.1 N/20 mm.

Next, an acrylic pressure-sensitive adhesive solution containing an acrylic polymer having a number average molecular weight of 800,000 was obtained by copolymerizing methyl acrylate 70 parts by weight, butyl acrylate 30 parts by weight, and acrylic acid 5 parts by weight in ethyl acetate. An acrylic pressure-sensitive adhesive was prepared by adding a polyisocyanate compound (Coronate L manufactured by Nippon Polyurethane Industry) 2 parts by weight into this solution. A conductive pressure-sensitive adhesive solution B was produced by adding nickel powder manufactured by Inco Special Products (trade name Type 123, a spike shape, particle diameter 3 to 7 μmϕ) 10 parts by weight into this pressure-sensitive adhesive solution as the conductive particles.

Each of the pressure-sensitive adhesive layers (the second conductive pressure-sensitive adhesive layer) for evaluating the conductivity and for measuring the 90 degree peeling-off adhesive strength was formed using this conductive pressure-sensitive adhesive solution B. A pressure-sensitive adhesive layer having a thickness of 5 μm was formed by applying the conductive pressure-sensitive adhesive solution A onto a copper foil having a thickness of 25 μm for evaluating the conductivity and a polyester film having a thickness of 25 μm for measuring the 90 degree peeling-off adhesive strength, and subjected to heat-crosslinking at 80° C. for 10 minutes.

Then, the surface resistivity and the volume resistivity of the pressure-sensitive adhesive layer for evaluating the conductivity were measured with the measurement method described later. As a result, the surface resistivity was $1.8 \times 10^{-1}$ $\Omega/\square$, and the volume resistivity was $5.5 \times 10^{-4}$ $\Omega \cdot cm$. Further, the 90 degree peeling-off adhesive strength of the pressure-sensitive adhesive layer for measuring the 90 degree peeling-off adhesive strength was measured in a thermostatic chamber at $23\pm3°$ C. with the measurement method described later. As a result, the 90 degree peeling-off adhesive strength was 1.5 N/20 mm.

The ultraviolet-ray curing-type pressure-sensitive adhesive layer (the first conductive pressure-sensitive adhesive layer) having a thickness of 25 μm was formed using an aluminum-deposited polyester film manufactured by Toray Advanced Film Co., Ltd. (trade name Metalumy TS, thickness of the aluminum-deposited layer 50 to 100 nm, total thickness 25 μm), applying the conductive pressure-sensitive adhesive solution A onto the aluminum-deposited surface, and by subjecting to heat-crosslinking at 80° C. for 10 minutes. Next, using the conductive pressure-sensitive adhesive solution B, a pressure-sensitive adhesive layer (the second conductive pressure-sensitive adhesive layer) having a thickness of 5 μm was formed by applying the solution B onto a release-treated surface of a polyester separator having a thickness of 50 μm that was release-treated and by heating and crosslinking at 80° C. for 10 minutes. Furthermore, the pressure-sensitive adhesive sheet for testing according to the present example was produced by applying the second conductive pressure-sensitive adhesive layer onto the ultraviolet-ray curing-type pressure-sensitive adhesive surface produced above and by performing ultraviolet ray irradiation (1000 mJ/cm$^2$).

The surface resistivity and the volume resistivity of the present base film were measured with the measurement method described later, and they were 1.5 $\Omega/\square$ and $7.3 \times 10^{-3}$ $\Omega \cdot cm$ respectively. Further, the 90 degree peeling-off adhesive strength of the present pressure-sensitive adhesive sheet measured in the same way was 2.0 N/20 mm, the surface resistivity was $5.5 \times 10^2$ $\Omega/\square$, and the volume resistivity was $5.5 \times 10^{-1}$ $\Omega \cdot cm$.

Example 2

In the present example, a pressure-sensitive adhesive sheet for testing according to the present example was produced in the same way as Example 1 except that a rolled copper foil manufactured by Nikko Materials Co., Ltd. (thickness 50 μm) was used as the base film.

The surface resistivity and the volume resistivity of the present base film were measured with the measurement method described later, and they were $6.4 \times 10^{-3}$ $\Omega/\square$ and $1.8 \times 10^{-6}$ $\Omega \cdot cm$ respectively. Further, the 90 degree peeling-off adhesive strength of the present pressure-sensitive adhesive sheet measured in the same way was 3.2 N/20 mm, the surface resistivity was $5.3 \times 10^{-2}$ $\Omega/\square$, and the volume resistivity was $1.6 \times 10^{-4}$ $\Omega \cdot cm$.

Reference Example 1

A conductive pressure-sensitive adhesive solution C was produced by adding nickel powder manufactured by Inco Special Products (trade name Type 123, a spike shape, particle diameter 3 to 7 μmφ) 50 parts by weight into the ultraviolet-ray curing-type acrylic pressure-sensitive adhesive solution produced in Example 1 as the conductive particles.

Each of the ultraviolet-ray curing-type pressure-sensitive adhesive layers for evaluating the conductivity and for measuring the 90 degree peeling-off adhesive strength was formed using this conductive pressure-sensitive adhesive solution C with the same method as the above-described Example 1, and the 90 degree peeling-off adhesive strength, the surface resistivity, and the volume resistivity were measured. As a result, the 90 degree peeling-off adhesive strength was 1.3 N/20 mm, the surface resistivity was 1.9 $\Omega/\square$, and the volume resistivity was $5.5 \times 10^{-3}$ $\Omega \cdot cm$.

Next, a conductive pressure-sensitive adhesive solution D was produced by adding nickel powder manufactured by Inco Special Products (trade name Type 123, a spike shape, particle diameter 3 to 7 μmφ) 200 parts by weight into the acrylic pressure-sensitive adhesive solution produced in Example 1 as the conductive particles.

Each of the pressure-sensitive adhesive layers (the second conductive pressure-sensitive adhesive layer) for evaluating the conductivity and for measuring the 90 degree peeling-off adhesive strength was formed using this conductive pressure-sensitive adhesive solution D. A pressure-sensitive adhesive layer having a thickness of 5 μm was formed by applying the conductive pressure-sensitive adhesive solution D onto a copper foil having a thickness of 25 μm for evaluating the conductivity and a polyester film having a thickness of 25 μm for measuring the 90 degree peeling-off adhesive strength respectively, and subjected to heat-crosslinking at 80° C. for 10 minutes.

Then, the surface resistivity and the volume resistivity of the pressure-sensitive adhesive layer for evaluating the conductivity were measured with the measurement method described later. As a result, the surface resistivity was $5.3 \times 10^{-2}$ $\Omega/\square$, and the volume resistivity was $1.6 \times 10^{-4}$ $\Omega \cdot cm$. Further, the 90 degree peeling-off adhesive strength of the pressure-sensitive adhesive layer for measuring the 90 degree peeling-off adhesive strength was measured in a thermostatic chamber at $23\pm3°$ C. with the measurement method described later. As a result, the 90 degree peeling-off adhesive strength was 0 N/20 mm.

Furthermore, a pressure-sensitive adhesive sheet for testing according to the present reference example was produced in the same way as the above-described Example 1 except that the conductive pressure-sensitive adhesive solutions C and D were used.

The 90 degree peeling-off adhesive strength, the surface resistivity, and the volume resistivity of the present pressure-sensitive adhesive sheet were measured with the measurement method described later, and the 90 degree peeling-off adhesive strength was 0 N/20 mm, the surface resistivity was $2.1 \times 10^2$ $\Omega/\square$, and the volume resistivity was $6.4 \times 10^{-1}$ $\Omega \cdot cm$.

(Measurement of the Number Average Molecular Weight)

The number average molecular weight of the compounded acrylic polymer was measured with the following method. The number average molecular weight was measured with a polystyrene conversion by dissolving the acrylic polymer into THF at 0.1 wt % and using a GPC (gel permeation chromatography). The detailed measurement conditions were as follows.

GPC apparatus: HLC-8120GPC manufactured by Tosoh Corporation

Column: (GMH$_{HR}$–H)+(GMH$_{HR}$–H)+(G2000H$_{HR}$) manufactured by Tosoh Corporation Flow rate: 0.8 ml/min Concentration: 0.1 wt %

Injection amount: 100 μl

Column temperature: 40° C.

Eluent: THF (Conductivity)

The conductivity of the surface of the pressure-sensitive adhesive layer was evaluated by peeling a separator from the pressure-sensitive adhesive sheet for testing and the like that were obtained in the examples and the reference example. The dicing process was performed solely with the pressure-sensitive adhesive sheet, and conditions were set such that each base film of all pressure-sensitive adhesive sheets was cut to a depth half the thickness. The conductivity evaluation was performed according to JIS K7194 using Lorester MP MCP-T350 manufactured by Mitsubishi Chemical Corporation, and the surface resistivity and the volume resistivity of the pressure-sensitive adhesive layer in the pressure-sensitive adhesive sheet were obtained. The calculation of the surface resistivity and the volume resistivity was performed based on a resistivity correction factor RCF of 4.532.

(Peeling-Off Adhesive Strength)

The pressure-sensitive adhesive sheets for testing obtained in the examples and the reference example were cut into rectangular strips having 20 mm width and were applied onto a silicon mirror wafer surface (manufactured by Shin-Etsu Handotai Co., Ltd.; CZN<100> 2.5-3.5 (4 inch)) at 23±3° C. (room temperature). Next, it was placed still in a room temperature atmosphere for 30 minutes, and then the 90 degree peeling-off adhesive strength was measured in a thermostatic chamber at 23±3° C. (peeling point moving speed 300 mm/sec).

(Evaluation of Dicing)

A semiconductor wafer (6 inch) having a thickness of 100 µm and a backside that is ground was mounted onto the pressure-sensitive adhesive sheets for testing obtained in the examples and the reference example at a temperature of 23±3° C., and then dicing was performed under the following conditions. Whether chip fly during dicing and chipping and crack in the chip after dicing occurred or not was evaluated. In the evaluation, among 20 semiconductor chips, the case in which even chip fly or chipping and cracking of the chip occurred once was marked with x, and the case of no occurrence was marked with ○.

[Dicing Conditions]

Dicer: DFD-651 manufactured by DISCO Corporation, Blade: 27HECC manufactured by DISCO Corporation, Blade rotation speed: 35000 rpm, Dicing speed: 50 mm/sec, and Dicing size: 10 mm×10 mm.

The dicing was performed to a cut depth that the ultraviolet-ray curing-type pressure-sensitive adhesive layer (the first conductive pressure-sensitive adhesive layer) was cut to the middle thereof.

(Result)

A conductive path was formed between the first conductive pressure-sensitive adhesive layer and the second conductive pressure-sensitive adhesive layer in any of the pressure-sensitive adhesive sheets for testing in Examples 1 and 2 and Reference Example 1 and the base film, and it was confirmed that the continuity test is possible before and after the dicing step even in a condition where the semiconductor wafer and the semiconductor chip are applied onto these pressure-sensitive adhesive sheets for testing. Furthermore, in the pressure-sensitive adhesive sheets for testing in Examples 1 and 2, chip fly during dicing, and chipping and cracking of the chip did not occur, and an extremely good dicing property was shown.

TABLE 1

| | Dicing Property |
|---|---|
| Example 1 | ○ |
| Example 2 | ○ |
| Reference Example 1 | X Chip Fly |

The invention claimed is:

1. A pressure-sensitive adhesive sheet for testing comprising a base film and only a single pressure-sensitive adhesive layer provided on the base film, wherein
the base film and the pressure-sensitive adhesive layer have conductivity, and an electrically conductive path is provided therebetween.

2. The pressure-sensitive adhesive sheet for testing according to claim 1, wherein the base film has a structure in which a conductive deposited layer is provided on a base material.

3. The pressure-sensitive adhesive sheet for testing according to claim 1, wherein the base film is made of a metal foil.

4. The pressure-sensitive adhesive sheet for testing according to claim 1, wherein the surface resistivity of the base film is 5 Ω/□ or less.

5. The pressure-sensitive adhesive sheet for testing according to claim 1, wherein the pressure-sensitive adhesive layer comprises a pressure-sensitive adhesive containing a (meth) acrylic polymer.

6. The pressure-sensitive adhesive sheet for testing according to claim 1, wherein the pressure-sensitive adhesive layer comprises a radiation curing type pressure-sensitive adhesive.

7. The pressure-sensitive adhesive sheet for testing according to claim 1, wherein the pressure-sensitive adhesive layer comprises a radiation curing type pressure-sensitive adhesive that is capable of reducing adhesive strength upon irradiation.

8. The pressure-sensitive adhesive sheet for testing according to claim 1, wherein the pressure-sensitive adhesive layer comprises a heat foaming-peeling type pressure-sensitive adhesive that is capable of reducing adhesive strength upon heating.

9. The pressure-sensitive adhesive sheet for testing comprising a base film and a pressure-sensitive adhesive layer provided on the base film, wherein the base film and the pressure-sensitive adhesive layer have conductivity, and an electrically conductive path is provided therebetween, and wherein the pressure-sensitive adhesive layer has a laminated structure in which a first conductive pressure-sensitive adhesive layer and a second conductive pressure-sensitive adhesive layer are laminated one by one from the base film side,
the surface resistivity of the first conductive pressure-sensitive adhesive layer is $1\times10^{-2}$ Ω/□ to 1 Ω/□, the surface resistivity of the second conductive pressure-sensitive adhesive layer is $1\times10^{-1}$ Ω/□ to $1\times10^{1}$ Ω/□, the adhesive strength of the first conductive pressure-sensitive adhesive layer is 1 N/20 mm or less, the adhesive strength of the second conductive pressure-sensitive adhesive layer is 1 N/20 mm or more, and the adhesive strength of the first conductive pressure-sensitive adhesive layer is smaller than the adhesive strength of the second conductive pressure-sensitive adhesive layer.

10. The pressure-sensitive adhesive sheet for testing according to claim 9, wherein conductive particles are contained in each of the first conductive pressure-sensitive adhesive layer and the second conductive pressure-sensitive adhesive layer, the content of the conductive particles is in a range of 1 to 500 parts by weight with respect to a base polymer component 100 parts by weight constituting each pressure-sensitive adhesive layer, and the content of the conductive particles in the first conductive pressure-sensitive adhesive layer is larger than the content of the conductive particles in the second conductive pressure-sensitive adhesive layer.

11. The pressure-sensitive adhesive sheet for testing according to claim 9, wherein the thickness of the first conductive pressure-sensitive adhesive layer is 5 to 100 μm, and the thickness of the second conductive pressure-sensitive adhesive layer is 1 to 30 μm.

12. A method of manufacturing a semiconductor device comprising:
   providing a pressure-sensitive adhesive sheet for testing comprising a base film and a pressure-sensitive adhesive layer provided on the base film, wherein the base film and the pressure-sensitive adhesive layer have conductivity, and an electrically conductive path is provided therebetween;
   applying a semiconductor wafer onto the pressure-sensitive adhesive layer in the pressure-sensitive adhesive sheet for testing with a surface opposite a circuit forming surface as an application surface;
   performing a continuity test on the semiconductor wafer through establishment of an electrical connection by placing the pressure-sensitive adhesive sheet for testing onto a conductive testing stage in a condition where the semiconductor wafer is fixed and by contacting one connection terminal to the circuit forming surface of the semiconductor wafer and contacting another connection terminal to the pressure-sensitive adhesive layer;
   forming a semiconductor chip in a condition where at least a portion of the base film is left by dicing the semiconductor wafer from the circuit forming surface side; and
   picking up the semiconductor chip from the pressure-sensitive adhesive sheet for testing.

13. A method of manufacturing a semiconductor device comprising:
   applying a dicing ring and a semiconductor wafer onto the pressure-sensitive adhesive layer in the pressure-sensitive adhesive sheet for testing according to claim 1 with a surface opposite a circuit forming surface as an application surface;
   forming semiconductor chips in a condition where at least a portion of the base film is left by dicing the semiconductor wafer from the circuit forming surface side;
   performing a continuity test on the semiconductor chips through establishment of an electrical connection by placing the pressure-sensitive adhesive sheet for testing onto a conductive testing stage in a condition where each semiconductor chip right after dicing is fixed and by contacting one connection terminal to the circuit forming surface of the semiconductor chip and contacting another connection terminal to the pressure-sensitive adhesive layer, the dicing ring, or the continuity testing stage; and
   picking up the semiconductor chips from the pressure-sensitive adhesive sheet for testing.

14. A method of manufacturing a semiconductor device comprising:
   applying a semiconductor wafer onto the pressure-sensitive adhesive layer in the pressure-sensitive adhesive sheet for testing according to claim 9 with a surface opposite a circuit forming surface as an application surface;
   performing a continuity test on the semiconductor wafer through establishment of an electrical connection by placing the pressure-sensitive adhesive sheet for testing onto a conductive testing stage in a condition where the semiconductor wafer is fixed and by contacting one connection terminal to the circuit forming surface of the semiconductor wafer and contacting another connection terminal to the pressure-sensitive adhesive layer;
   forming a semiconductor chip in a condition where at least a portion of the base film is left by dicing the semiconductor wafer from the circuit forming surface side; and
   picking up the semiconductor chip from the pressure-sensitive adhesive sheet for testing.

15. A method of manufacturing a semiconductor device comprising:
   applying a dicing ring and a semiconductor wafer onto the pressure-sensitive adhesive layer in the pressure-sensitive adhesive sheet for testing according to claim 9 with a surface opposite a circuit forming surface as an application surface;
   forming semiconductor chips in a condition where at least a portion of the base film is left by dicing the semiconductor wafer from the circuit forming surface side;
   performing a continuity test on the semiconductor chips through establishment of an electrical connection by placing the pressure-sensitive adhesive sheet for testing onto a conductive testing stage in a condition where each semiconductor chip right after dicing is fixed and by contacting one connection terminal to the circuit forming surface of the semiconductor chip and contacting another connection terminal to the pressure-sensitive adhesive layer, the dicing ring, or the continuity testing stage; and
   picking up the semiconductor chips from the pressure-sensitive adhesive sheet for testing.

* * * * *

UNITED STATES PATENT AND TRADEMARK OFFICE
CERTIFICATE OF CORRECTION

PATENT NO. : 8,146,438 B2
APPLICATION NO. : 12/513230
DATED : April 3, 2012
INVENTOR(S) : Yoshio Terada et al.

It is certified that error appears in the above-identified patent and that said Letters Patent is hereby corrected as shown below:

At Column 1, Line 53, after "04-070937" please insert --.--.

At Column 2, Line 45, please change "pressure sensitive" to --pressure-sensitive--.

At Column 5, Line 54, after "sheet" please insert --10--.

At Column 7, Line 14, please change "particles" to --particles 5--.

At Column 7, Line 43, please change "to 200" to --10 to 200--.

At Column 10, Line 25-26, please change "(Meth) Acrylic Polymer can be Performed" to --(meth)acrylic polymer can be performed--.

At Column 10, Line 42-43, please change "azobisisobutylonitrile," to --azobisisobutyronitrile,--.

At Column 11, Line 27, please change "trimethyloipropane" to --trimethylolpropane--.

At Column 11, Line 30-31, please change "dipentaerythiritol" to --dipentaerythritol--.

At Column 11, Line 59, please change "anizoin" to --benzoin--.

At Column 11, Line 64, please change "propanedion" to --propanediol--.

At Column 13, Line 44, please change "sheet" to --sheet 10--.

At Column 14, Line 31, please change "water" to --wafer--.

At Column 15, Line 32 (Approx.), after "sheet" please insert --10--.

At Column 16, Line 5, please change "hexacrylate" to --hexaacrylate--.

Signed and Sealed this
Ninth Day of October, 2012

David J. Kappos
*Director of the United States Patent and Trademark Office*